(12) United States Patent
Li et al.

(10) Patent No.: US 10,147,808 B1
(45) Date of Patent: Dec. 4, 2018

(54) TECHNIQUES FOR FORMING VERTICAL TUNNELING FETS

(71) Applicant: International Business Machines Corporation, Armonk, NY (US)

(72) Inventors: Juntao Li, Cohoes, NY (US); Kangguo Cheng, Schenectady, NY (US); Xin Miao, Guilderland, NY (US); Peng Xu, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/831,227

(22) Filed: Dec. 4, 2017

(51) Int. Cl.
H01L 29/66 (2006.01)
H01L 29/06 (2006.01)
H01L 29/08 (2006.01)
H01L 29/78 (2006.01)

(52) U.S. Cl.
CPC .... *H01L 29/66977* (2013.01); *H01L 29/0653* (2013.01); *H01L 29/0847* (2013.01); *H01L 29/6653* (2013.01); *H01L 29/66553* (2013.01); *H01L 29/66666* (2013.01); *H01L 29/7827* (2013.01)

(58) Field of Classification Search
CPC ........... H01L 29/66977; H01L 29/7827; H01L 29/6653; H01L 29/0847; H01L 29/66553; H01L 29/0653
See application file for complete search history.

(56) References Cited

U.S. PATENT DOCUMENTS

| 8,258,031 | B2 | 9/2012 | Lauer et al. |
| 8,471,329 | B2 | 6/2013 | Bhuwalka et al. |
| 8,754,470 | B1 * | 6/2014 | Chuang ............. H01L 29/66356 257/135 |
| 8,916,927 | B2 | 12/2014 | Bhuwalka et al. |
| 9,385,195 | B1 | 7/2016 | Zhang |
| 9,425,296 | B2 | 8/2016 | Li et al. |
| 9,748,382 | B1 * | 8/2017 | Gluschenkov ...... H01L 29/7827 |
| 2007/0052012 | A1 | 3/2007 | Forbes |

(Continued)

OTHER PUBLICATIONS

P.G. Der Agopian et al., "Experimental comparison between trigate p-TFET and p-FinFET analog performance as a function of temperature," IEEE Transactions on Electron Devices, vol. 60, No. 8, Aug. 2013, pp. 2493-2497.

(Continued)

*Primary Examiner* — Laura Menz
*Assistant Examiner* — Candice Y Chan
(74) *Attorney, Agent, or Firm* — Vazken Alexanian; Michael J. Chang, LLC

(57) ABSTRACT

Techniques for increasing a source-to-channel tunneling area in TFETs are provided. In one aspect, a method of forming a vertical TFET includes: patterning at least one pair of fins in an undoped semiconductor layer (vertical fin channels) and doped drain layer, filling gaps between the pair of fins with a dielectric; forming gates along outer sides of the pair of fins; partially recessing the dielectric to form a trench in between the pair of fins; forming a doped source layer in the trench overlapping the vertical fin channels. A vertical TFET device formed by the method is also provided, as is a vertical TFET device and method for formation thereof where a positioning of the doped source layer and the gates is reversed.

9 Claims, 10 Drawing Sheets

(56) References Cited

U.S. PATENT DOCUMENTS

| | | | |
|---|---|---|---|
| 2007/0228491 A1 | 10/2007 | Forbes | |
| 2011/0253981 A1* | 10/2011 | Rooyackers | B82Y 10/00 |
| | | | 257/24 |
| 2014/0353593 A1* | 12/2014 | Smets | H01L 29/66666 |
| | | | 257/39 |

OTHER PUBLICATIONS

K. Hemanjaneyulu et al., "Fin enabled area scaled tunnel FET," IEEE Transactions on Electron Devices, vol. 62, No. 10, Oct. 2015, pp. 3184-3191.

S. Cristoloveanu et al., "A Review of Sharp-Switching Devices for Ultra-Low Power Applications," Journal of the Electron Devices Society, vol. 4, No. 5, pp. 215-226 (Sep. 2016).

* cited by examiner (Following from FIG. 6)

TECHNIQUES FOR FORMING VERTICAL TUNNELING FETS

FIELD OF THE INVENTION

The present invention relates to vertical tunnel field effect transistors (TFETs), and more particularly, to techniques for increasing a source-to-channel tunneling area in vertical TFETs and thereby increase on current (Ion).

BACKGROUND OF THE INVENTION

Tunnel field effect transistors (TFETs), which use a band-to-band tunneling (BTBT) mechanism, have been investigated as one of the most promising next-generation devices for low-power applications. However, scaling-down complementary metal oxide semiconductor (CMOS) transistors results in increased power consumption and short channel effects.

In conventional planar TFETs, the on current (Ion) is limited by the inversion layer thickness (tunneling area), which is only a couple of nanometers or less. See, for example, S. Cristoloveanu et al., "A Review of Sharp-Switching Devices for Ultra-Low Power Applications," Journal of the Electron Devices Society, Vol. 4, no. 5, pgs. 215-226 (September 2016) (hereinafter "Cristoloveanu"). For instance, as shown in FIG. 2a of Cristoloveanu, with a planar TFET design the tunneling area is limited to a top corner portion of the source and drain. This tunneling area is small because the channel is only a couple of nanometers or less beneath the gate.

Therefore, TFET designs with increased tunneling area and Ion would be desirable.

SUMMARY OF THE INVENTION

The present invention provides techniques for increasing a source-to-channel tunneling area in vertical tunnel field effect transistors (TFETs), thereby increasing on current (Ion). In one aspect of the invention, a method of forming a vertical TFET is provided. The method includes: forming a doped drain layer on a substrate; forming an undoped semiconductor layer on the doped drain layer; patterning at least one pair of fins in the undoped semiconductor layer and the doped drain layer, wherein portions of the at least one pair of fins patterned in the undoped semiconductor layer include vertical fin channels; filling a gap between the at least one pair of fins with a dielectric; forming first bottom spacers on the doped drain layer outside of the at least one pair of fins; forming gates along outer sides of the at least one pair of fins; partially recessing the dielectric to form a trench in between the at least one pair of fins with a portion of the dielectric film remaining as second bottom spacers in the trench; and forming a doped source layer in the trench on top of the second bottom spacers and overlapping the vertical fin channels, wherein an overlap of the doped source layer and the vertical fin channels is greater than 50% of a length of the vertical fin channels.

In another aspect of the invention, another method of forming a vertical TFET is provided. The method includes: forming a doped drain layer on a substrate; forming an undoped semiconductor layer on the doped drain layer; patterning at least one pair of fins in the undoped semiconductor layer and the doped drain layer, wherein portions of the at least one pair of fins patterned in the undoped semiconductor layer include vertical fin channels; filling a gap between the at least one pair of fins with a dielectric; forming first bottom spacers on the doped drain layer in between the at least one pair of fins; forming a doped source layer along outer sides of the at least one pair of fins overlapping the vertical fin channels; partially recessing the dielectric to form a trench in between the at least one pair of fins with a portion of the dielectric remaining as a second bottom spacer at a bottom of the trench; and forming a gate in the trench on top of the second bottom spacers, wherein an overlap of the doped source layer and the vertical fin channels is greater than 50% of a length of the vertical fin channels.

In yet another aspect of the invention, a vertical TFET is provided. The vertical TFET includes: a doped drain layer disposed on a substrate; an undoped semiconductor layer disposed on the doped drain layer; at least one pair of fins patterned in the undoped semiconductor layer and the doped drain layer, wherein portions of the at least one pair of fins patterned in the undoped semiconductor layer include vertical fin channels; first bottom spacers disposed on the doped drain layer outside of the at least one pair of fins; gates disposed along outer sides of the at least one pair of fins; second bottom spacers disposed on the doped drain layer in between the at least one pair of fins; and a doped source layer disposed in between the at least one pair of fins on top of the second bottom spacers and overlapping the vertical fin channels, wherein an overlap of the doped source layer and the vertical fin channels is greater than 50% of a length of the vertical fin channels.

In still yet another aspect of the invention, another vertical TFET is provided. The vertical TFET includes: a doped drain layer disposed on a substrate; an undoped semiconductor layer disposed on the doped drain layer; at least one pair of fins patterned in the undoped semiconductor layer and the doped drain layer, wherein portions of the at least one pair of fins patterned in the undoped semiconductor layer include vertical fin channels; first bottom spacers disposed on the doped drain layer in between the at least one pair of fins; a doped source layer disposed along outer sides of the at least one pair of fins overlapping the vertical fin channels; second bottom spacers disposed on the doped drain layer in between the at least one pair of fins; and gates disposed in between the at least one pair of fins on top of the second bottom spacers and overlapping the vertical fin channels, wherein an overlap of the doped source layer and the vertical fin channels is greater than 50% of a length of the vertical fin channels.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for increasing the tunneling area in tunnel field effect transistors (TFETs) using a vertical (as opposed to planar) TFET design with a large source-to-channel overlap. A large source-to-channel overlap increases the tunneling area, which advantageously increases the on current (Ion) of the device.

A number of different vertical TFET designs and techniques for formation thereof will be presented herein. As will be described in detail below, each of the present vertical TFET designs will include pairs of adjacent vertical fin channels interconnecting a source and a drain, and a gate to regulate current flow through the vertical fin channels. The embodiments described below differ based on the placement of the source and gate relative to the pair of vertical fin channels, e.g., in between or on the outer sides of the pair of vertical fin channels.

Figure 1:
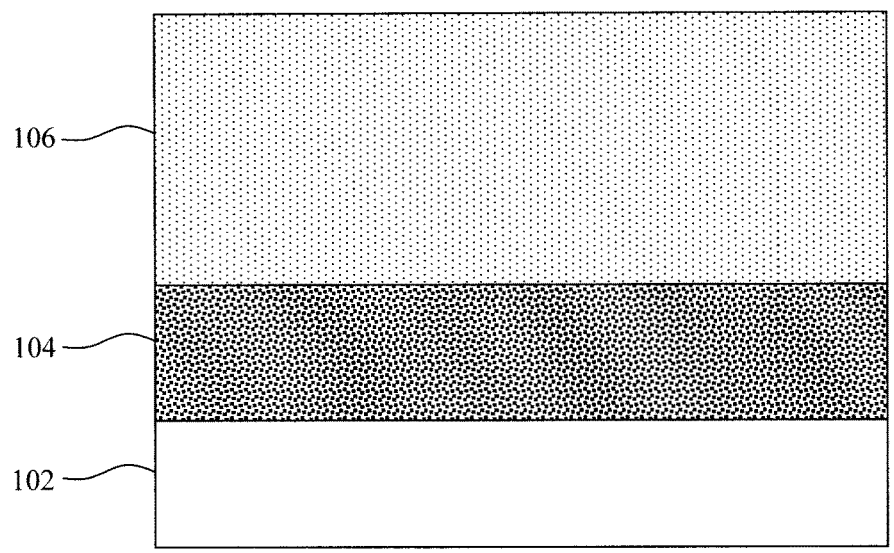
FIG. 1 is a cross-sectional diagram illustrating a starting structure for forming a vertical tunnel field effect transistor (TFET) including a doped epitaxial drain layer disposed on a substrate, and an intrinsic epitaxial silicon (Si) layer disposed on the doped epitaxial drain layer according to an embodiment of the present invention.

A first exemplary embodiment for forming a vertical TFET in accordance with the present techniques is now described by way of reference to FIGS. 1-12. As shown in FIG. 1, the process begins with a substrate 102 on which a doped drain layer 104 is formed. Doping can be performed using processes, such as ion implantation, in-situ, gas phase doping, plasma doping, plasma immersion ion implantation, cluster doping, infusion doping, liquid phase doping, solid phase doping. Suitable dopants include, but are not limited to, an n-type dopant selected from a group of phosphorus (P), arsenic (As) and/or antimony (Sb), and a p-type dopant selected from a group of boron (B), boron fluoride ($BF_2$), gallium (Ga), indium (In), and/or thallium (Tl) at various concentrations. By way of example, only, the dopant concentration can be from about $1×10^{18}$ atoms/$cm^3$ to about $5×10^{21}$ atoms/$cm^3$, and ranges therebetween. However, lower or higher dopant concentrations are also contemplated. By way of example, a dopant region is implanted with arsenic or phosphorus to form an n-type region. The dopant concentration within the dopant region may range from about $1×10^{18}$ atoms/$cm^3$ to about $5×10^{21}$ atoms/$cm^3$, and ranges therebetween, e.g., from about $5×10^{19}$ atoms/$cm^3$ to about $1×10^{21}$ atoms/$cm^3$, and ranges therebetween. In another example, a dopant region is implanted with boron or $BF_2$ to form a p-type region. The dopant concentration within the dopant region may range from about $1×10^{18}$ atoms/$cm^3$ to about $5×10^{21}$ atoms/$cm^3$, and ranges therebetween, e.g., from about $5×10^{19}$ atoms/$cm^3$ to about $1×10^{21}$ atoms/$cm^3$.

A variety of different substrate 102 configurations can be implemented in accordance with the present techniques. For instance, according to one exemplary embodiment, the starting substrate 102 is a bulk semiconductor wafer, such as a bulk silicon (Si), bulk germanium (Ge) and/or bulk silicon germanium (SiGe) wafer. In one exemplary embodiment, the substrate is a compound semiconductor material such as silicon carbide (SiC), gallium nitride (GaN), indium gallium arsenide (InGaAs), indium phosphide (InP), and/or zinc antimonide (ZnSb). Alternatively, substrate 102 can be a semiconductor-on-insulator (SOI) wafer. In general, a SOI wafer includes a SOI layer separated from an underlying substrate by a buried insulator. When the buried insulator is an oxide it is referred to as a buried oxide or BOX. The SOI layer can include any suitable semiconductor, such as Si, Ge and/or SiGe.

According to an exemplary embodiment, doped drain layer 104 is formed from an epitaxial material grown on the substrate 102. Suitable epitaxial materials for the doped drain layer 104 include, but are not limited to, epitaxial silicon (Si), epitaxial germanium (Ge) and/or epitaxial silicon germanium (SiGe) that is in-situ doped (i.e., during growth) or ex-situ doped (e.g., via a process such as ion implantation) with an n-type or p-type dopant. Suitable n-type and p-type dopants were provided above. By way of example only, the doped drain layer 104 can have a thickness of from about 5 nanometers (nm) to about 500 nm and ranges therebetween, for example, from about 10 nm to about 200 nm and ranges therebetween, e.g., from about 20 nm to about 100 nm and ranges therebetween.

As shown in FIG. 1, an intrinsic semiconductor layer 106 is next formed on the doped drain layer 104. By 'intrinsic' it is meant that the layer 106 is undoped. Intrinsic semiconductor layer 106 will serve as the basis for forming the vertical fin channels of the TFET device. According to an exemplary embodiment, the intrinsic semiconductor layer 106 is formed from epitaxial Si, epitaxial Ge and/or SiGe grown on the doped drain layer 104.

Steps are next taken to pattern fins in the intrinsic semiconductor layer 106 (and a portion of the doped drain layer 104—see below). To do so, fin hardmasks are needed marking the footprint and location of each of the fins. The fin hardmasks can be formed using direct patterning techniques. However, according to an exemplary embodiment, a sidewall image transfer (SIT) process is used to pattern the fin hardmasks.

Figure 2:
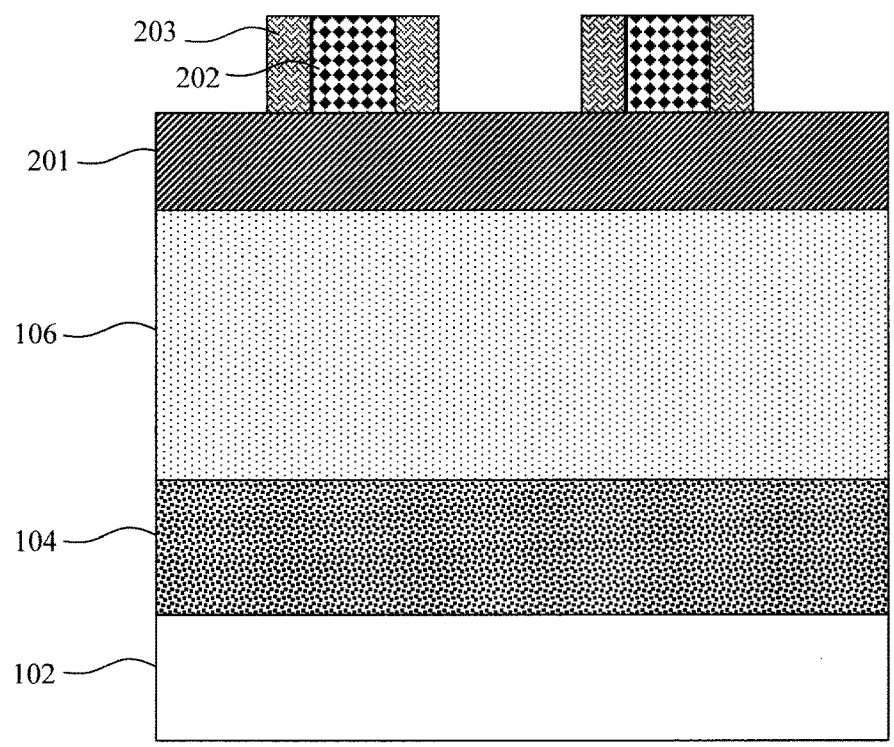
FIG. 2 is a cross-sectional diagram illustrating mandrels having been patterned on the intrinsic epitaxial Si layer, and sidewall spacers having been formed on opposite sides of the mandrels according to an embodiment of the present invention.

For instance, as shown in FIG. 2 a hardmask layer 201 is deposited onto intrinsic semiconductor layer 106. Suitable hardmask materials include, but are not limited to, a nitride hardmask material such as silicon nitride (SiN). Standard lithography and etching techniques are the used to pattern mandrels 202 on the intrinsic hardmask layer 201. The mandrels 202 are a sacrificial structure used merely to place sidewall spacers for fin patterning. Thus, the mandrels 202 are formed from a material that can be selectively removed relative to the sidewall spacers. Suitable materials for the mandrels 202 include, but are not limited to, amorphous Si, poly-Si, amorphous carbon, SiGe, an organic planarization layer (OPL), silicon dioxide ($SiO_2$) and/or silicon nitride (SiN).

Following patterning of the mandrels 202, sidewall spacers 203 are formed on opposite sides of the mandrels. See FIG. 2. By way of example only, a suitable spacer material is blanket deposited onto and covering the mandrels 202 and then patterned into individual spacers 203. Suitable materials for spacers 203 include, but are not limited to, $SiO_2$, SiN, silicon oxynitride (SiON), silicon carbide (SiC) and/or amorphous carbon. However, as provided above, the mandrels 202 will be removed selective to the spacers 203. Thus, the choice of mandrel and spacer material should be made to permit this selectivity. For instance, when the mandrels 202 are formed from an oxide such as $SiO_2$, the spacers 203 can be formed from a nitride (SiN), or vice versa. As such, an oxide- or nitride-selective etch can be used to remove one (oxide or nitride) relative to the other. According to a non-limiting exemplary embodiment, the mandrels 202 are formed from an oxide material and the spacers 203 are formed from a nitride material. Thus, after removal of the mandrels 202 a nitride fin hardmask formed by the spacers 203 remains for fin patterning.

Figure 3:
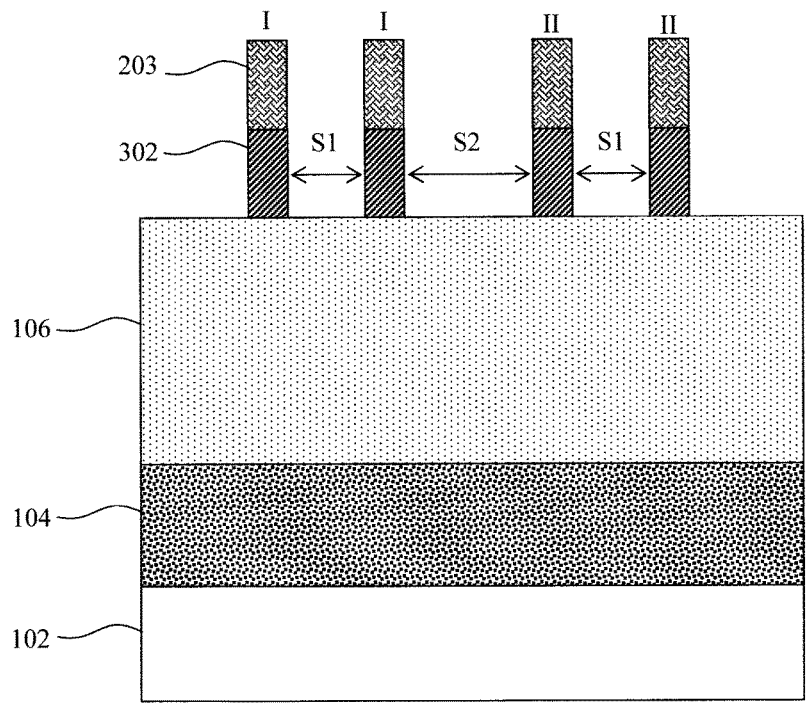
FIG. 3 is a cross-sectional diagram illustrating the mandrels having been selectively removed according to an embodiment of the present invention.

Specifically, as shown in FIG. 3 the mandrels 202 have been removed selective to the spacers 203, and the spacers 203 have been used to pattern the hardmask layer 201 into individual fin hardmasks 302 on the intrinsic semiconductor layer 106. Advantageously, an SIT process is a pitch doubling technique. Namely, there are now two fin hardmasks 302 for each mandrel 202 originally patterned on hardmask layer 201. SIT thus permits the patterning of fin hardmasks 302 at a sub-lithographic pitch, i.e., the spacers 203 are present at a smaller pitch than the (direct patterned) mandrels 202.

As shown in FIG. 3, the fin hardmasks 302 are grouped into pairs (i.e., pair I and pair II in this example), and the spacing S1 between the fin hardmasks 302 in a given pair (i.e., spacing S1 between the fin hardmasks 302 in pair I and the spacing S1 between the fin hardmasks 302 in pair II) is less than the spacing S2 between the pairs (i.e., the spacing between pair I and pair II), i.e., S1<S2. As will be described in detail below, this configuration of the fin hardmasks 302, which will be transferred to the fins, permits pairs of fins (of spacing S1 in this example) to be pinched off (e.g., with a dielectric) without completely closing the gap (of spacing S2 in this example) between the pairs of fins. In the SIT example provided above, varying the spacing between the mandrels 202 can introduce a larger spacing between groups of adjacent fin hardmasks 302 (for instance, in the example above the mandrels 202 themselves set the spacing S1 within each pair of fin hardmasks 302 (pair I or II), while the spacing between the mandrels 202 sets the spacing S2 between pairs (between pair I and II) of adjacent fin hardmasks 302. Following patterning of the fin hardmasks 302, the spacers 203 are removed.

Figure 4:
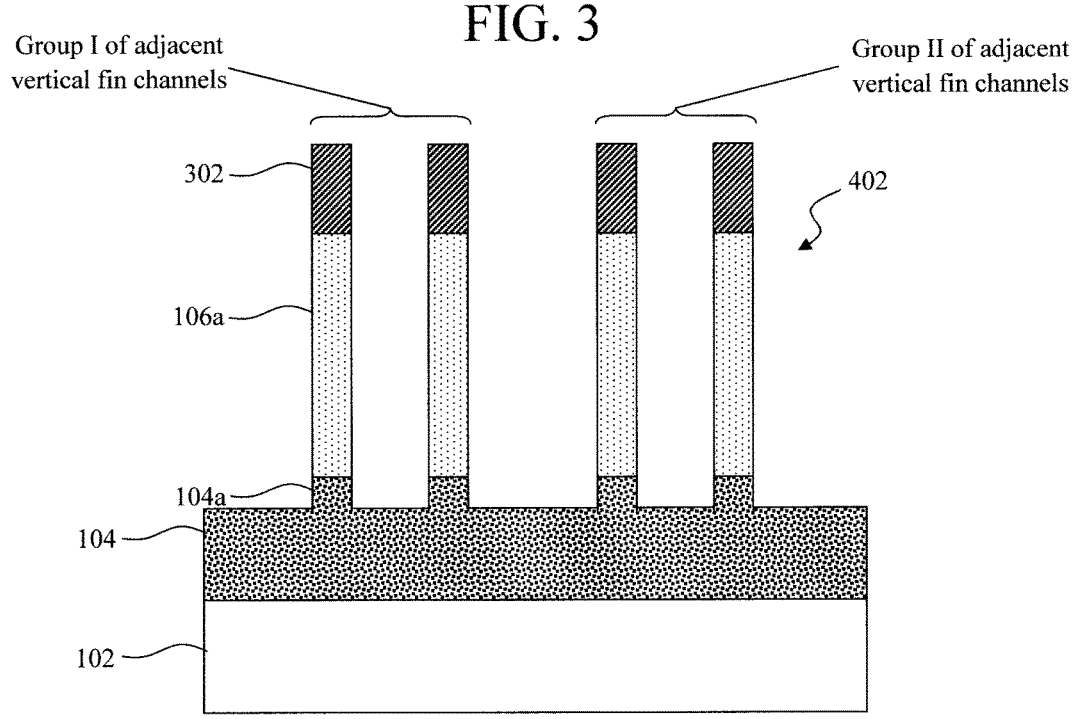
FIG. 4 is a cross-sectional diagram illustrating the spacers having been used as fin hardmasks to pattern the intrinsic epitaxial Si layer and a portion of the doped epitaxial drain layer into at least one first pair and at least one second pair of fins according to an embodiment of the present invention.

As shown in FIG. 4, the fin hardmasks 302 are then used to pattern the intrinsic semiconductor layer 106 and a portion of the doped drain layer 104 into individual fins 402. An anisotropic etching process such as reactive ion etching (RIE) can be employed for the fin etch. As shown in FIG. 4, the fins 402 extend completely through the intrinsic semiconductor layer 106 and partway into the doped drain layer 104. As such, each of the fins 402 will include a portion 106a of the intrinsic semiconductor layer 106 and a portion 104a of the doped drain layer 104. The portions 106a of the intrinsic semiconductor layer 106 are vertical fin channels of the TFET devices.

Figure 5:
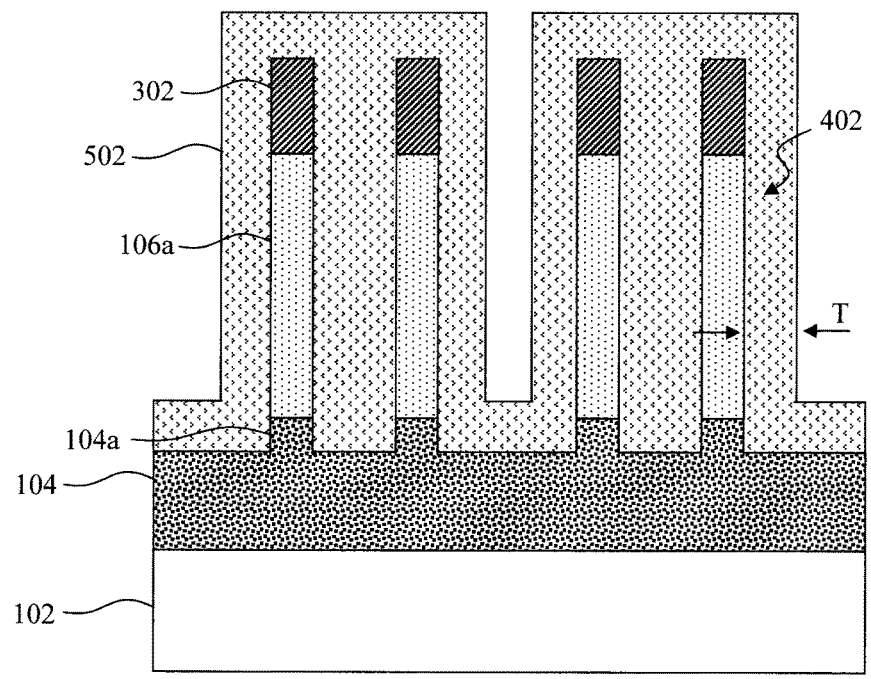
FIG. 5 is a cross-sectional diagram illustrating a conformal nitride film having been deposited onto the fins according to an embodiment of the present invention.
Figure 6:
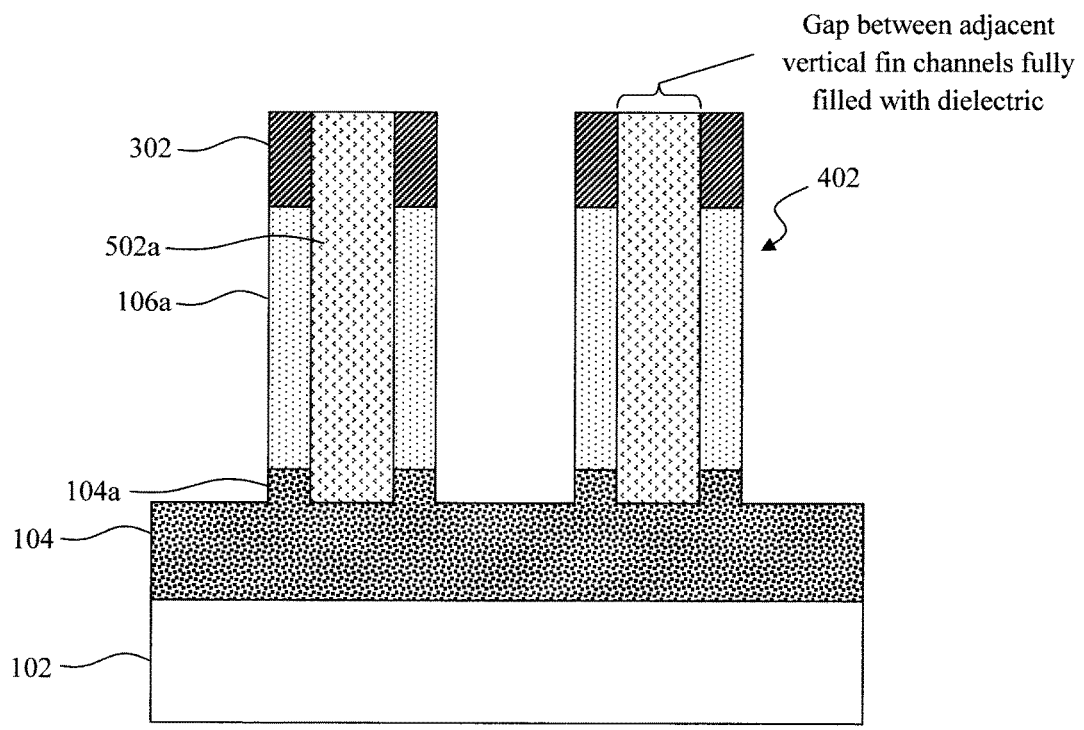
FIG. 6 is a cross-sectional diagram illustrating a recess of the conformal nitride film having been performed such that a portion of the conformal nitride film remains present in (and fully filling) the gap within the pairs of fins according to an embodiment of the present invention.

Next, as shown in FIG. 5, a conformal dielectric 502 is deposited onto the fins 402 by a conformal deposition process such as a chemical vapor deposition (CVD) or an atomic layer deposition (ALD) process. In general, the dielectric 502 can be any material that can be etched selective to the fill material(s) (e.g., oxide fill material 1004) that will be used throughout the process. For example, suitable materials for the dielectric 502 include, but are not limited to, SiN and/or SiON. Preferably, the dielectric 502 is deposited so as to pinch off the gap within the pairs of fins 402 (of spacing S1 in the above example) without completely closing the gap (of spacing S2 in the above example) between the pairs of fins 402. To look at it another way, the dielectric 502 is preferably configured to have a thickness T that is greater than one half of the spacing S1, i.e., T>½ S1, but less than one half of the spacing S2, i.e., T<½ S2. As provided above, the spacing S1 within the pairs of fin hardmasks 204/fins 402 can be adjusted vis-à-vis the spacing S2 between the pairs of fin hardmasks 302/fins 402.

By pinching off the adjacent vertical fin channels, when a recess of the dielectric 502 is performed a portion 502a of the dielectric 502 remains present in (and fully filling) the gap within the pairs of fins 402. See FIG. 6. For instance, use of an isotropic etch will remove exposed portions of the dielectric 502. However, the portion 502a of the conformal dielectric 502 is concealed in the gap within the pairs of fins 402 and thus is protected from the etch.

In the completed vertical TFET, the doped drain layer 104 will serve as the drain. Spacers are needed to offset the drain from the gate (to be formed below). As such, as shown in FIG. 7 (first) bottom spacers 702 are formed on the doped drain layer 104 (i.e., the drain) in between the fins 402 (outside of the pairs of fins 402).

According to an exemplary embodiment, the bottom spacers 702 are formed using a directional deposition process whereby a spacer material is deposited onto the doped epitaxial drain layer 104 and fins 402 with a greater amount of the material being deposited on the horizontal surfaces, as compared to the vertical surfaces. To use an illustrative example, a greater thickness of the spacer material will be deposited on top of the doped epitaxial drain layer 104 in between the fins 402 than along the sidewalls of the fins 402. Thus, when an etch is used on the spacer material, the timing of the etch needed to remove the spacer material from the vertical surfaces will leave the bottom spacers 702 shown in FIG. 7 on top of the doped drain layer 104 (i.e., the drain) outside of the pair of fins 402 since a greater amount of the spacer material was present on the doped drain layer 104 to begin with.

Figure 7:
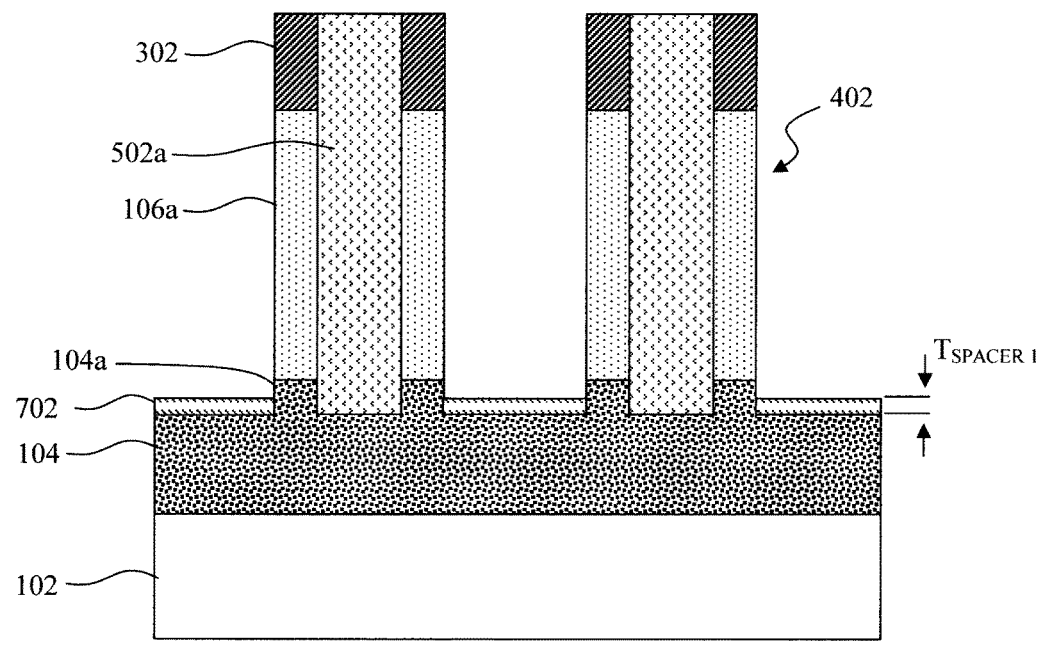
FIG. 7 is a cross-sectional diagram illustrating (first) bottom spacers having been formed on the doped epitaxial drain layer in between the (pairs) of fins according to an embodiment of the present invention.
Figure 8:
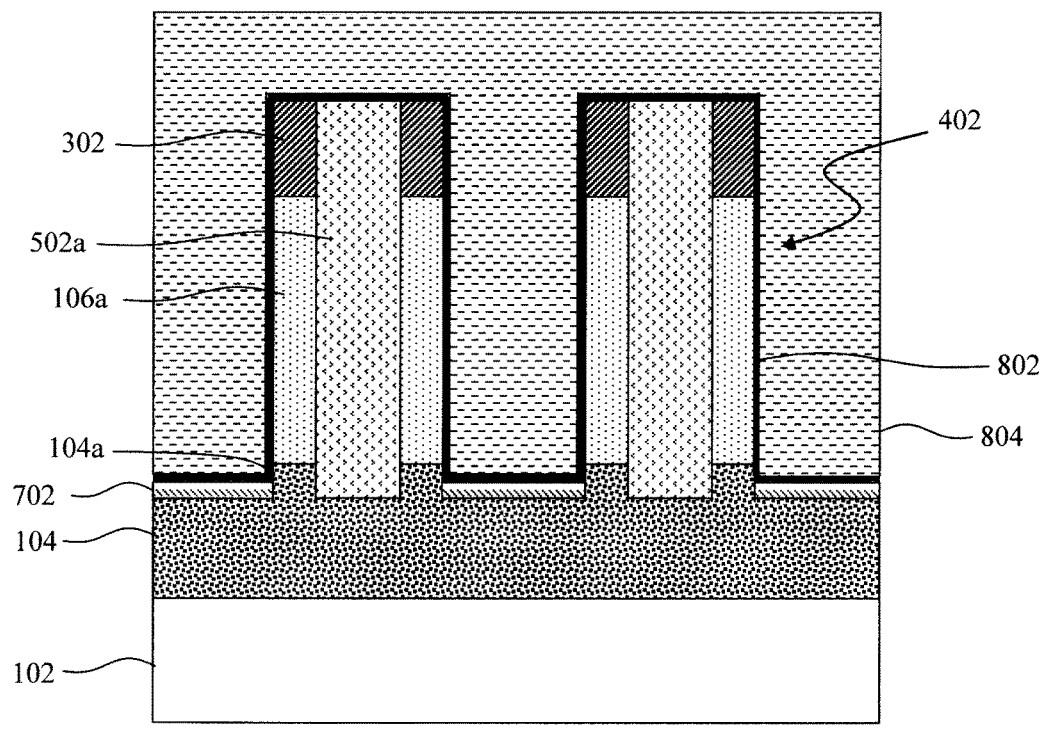
FIG. 8 is a cross-sectional diagram illustrating gates having been formed along the fins by depositing a conformal gate dielectric onto the outer sides of the pairs of fins, and depositing a gate conductor onto the gate dielectric according to an embodiment of the present invention.

As shown in FIG. 7, the bottom spacers 702 have a thickness ($T_{SPACER1}$). As will be described in detail below, second bottom spacers will be formed that are thicker than bottom spacers 702. The reason for this thickness difference is that while the (first) bottom spacers 702 offset the gates from the drain, the second bottom spacers are needed to offset the source from the drain.

By way of example only, a high density plasma (HDP) chemical vapor deposition (CVD) or physical vapor deposition (PVD) process can be used for directional film deposition, and an isotropic etch can be used to remove the (thinner) spacer material deposited onto the vertical surfaces. Generally, the bottom spacers 702 can be formed from any insulating dielectric that physically separates and electrically insulates the doped drain layer 104 from a gate (to be formed—see below). Suitable materials for the bottom spacers 702 include, but are not limited to, oxide spacer materials such as $SiO_2$ and/or silicon carbon oxide (SiCO), and nitride spacer materials such as SiN, silicon boron carbon nitride (SiBCN), silicon oxycarbon nitride (SiOCN), and/or silicon carbon nitride (SiCN) or combinations thereof. According to an exemplary embodiment, the bottom spacers 702 have a thickness of from about 3 nm to about 25 nm and ranges therebetween, for example, from about 5 nm to about 20 nm and ranges therebetween.

Gates (i.e., a gate dielectric and a gate conductor) are now formed along the fins 402. In this exemplary embodiment, the gates are formed along outer sides of each pair of fins 402, while the sources will be formed in the gaps within the pairs of fins 402 (i.e., in the gaps between the fins in each pair of fins). In the alternative exemplary embodiment presented below, the opposite configuration is employed whereby the sources are formed along outer sides of each pair of fins 402, while the gates are formed in the gaps within the pairs of fins 402.

According to an exemplary embodiment, the gates include a conformal gate dielectric 802 that is deposited onto the fins 402 (in this case along outer sides of the pairs of fins 402 since the gaps between the fins 402 in each pair is filled with the portion 502a of the dielectric 502), and a gate conductor 804 that is deposited onto the gate dielectric 802. See FIG. 8.

The gate dielectric 802 can be formed by a conformal deposition (e.g., ALD or PEALD), where the deposition forms a gate dielectric 802 of a predetermined thickness. According to an exemplary embodiment, the gate dielectric 802 has a thickness of from about 2 angstroms (Å) to about 10 nm and ranges therebetween, for example, from about 4 Å to about 5 nm and ranges therebetween, e.g., from about 1 nm to about 3 nm and ranges therebetween. In one exemplary embodiment, the gate dielectric 802 is an insulating dielectric, for example, silicon oxide (SiO), silicon nitride (SiN), silicon oxynitride (SiON), a high-κ dielectric, or combinations thereof. In another exemplary embodiment, the gate dielectric 802 is a high-κ dielectric material including, but not limited to, transition metal oxides such as hafnium oxide ($HfO_2$), hafnium silicon oxide ($HfSiO_4$), hafnium silicon oxynitride ($Hf_wSi_xO_yN_z$), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride ($Zr_wSi_xO_yN_z$), tantalum oxide ($TaO_2$, $Ta_2O_5$), titanium oxide ($TiO_2$), barium strontium titanium oxide ($BaTiO_3$—$SrTiO_3$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc_xTa_{1-x})O_3$), and lead zinc niobate ($PbZn_{1/3}Nb_{2/3}O_3$). The high-κ material can further include dopants such as lanthanum and/or aluminum. The stoichiometry of the high-κ compounds can vary. The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide).

In one exemplary embodiment, the conformal gate conductor 804 is a workfunction-setting metal. The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. According to an exemplary embodiment, the work function layer has a thickness of from about 3 nm to about 11 nm and ranges therebetween, for example, from about 5 nm to about 8 nm and ranges therebetween. The gate structure may further include appropriate conductive materials including, but not limited to, metals such as tungsten, nickel, titanium, molybdenum, tantalum, copper, platinum, silver, gold, ruthenium, iridium, rhenium, rhodium, and alloys thereof, polysilicon, or a conducting metallic compound material such as tantalum nitride, titanium nitride, tungsten silicide, tungsten nitride, ruthenium oxide, cobalt silicide, or nickel silicide. The conductive material may further include dopants that are incorporated during or after deposition.

Figure 9:
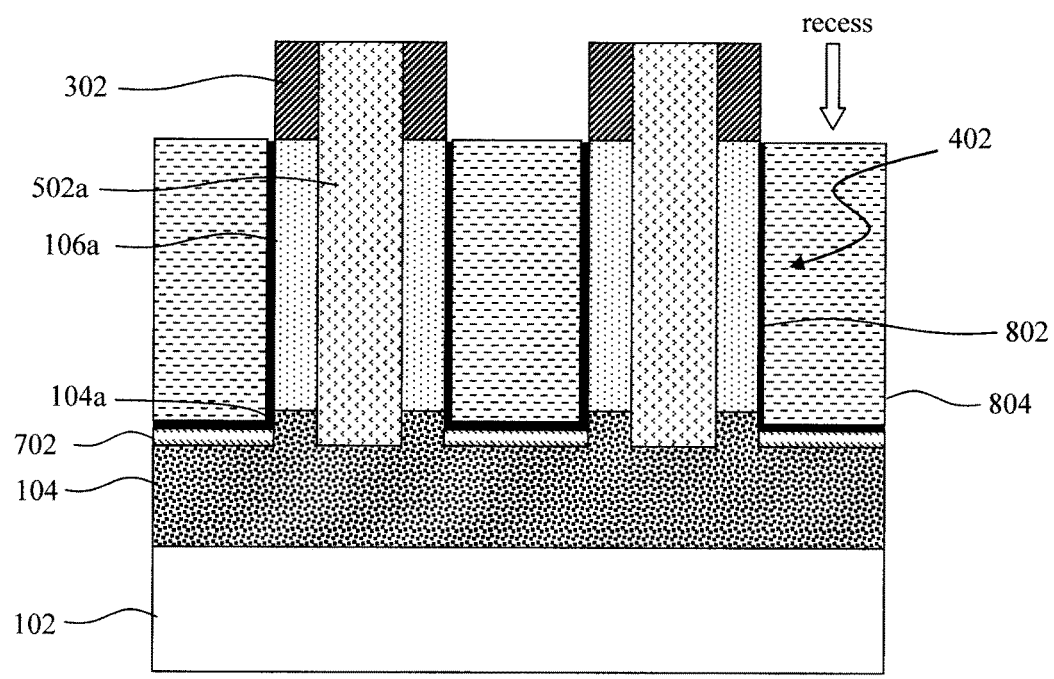
FIG. 9 is a cross-sectional diagram illustrating the gate dielectric and the gate conductor having been recessed according to an embodiment of the present invention.
Figure 10:
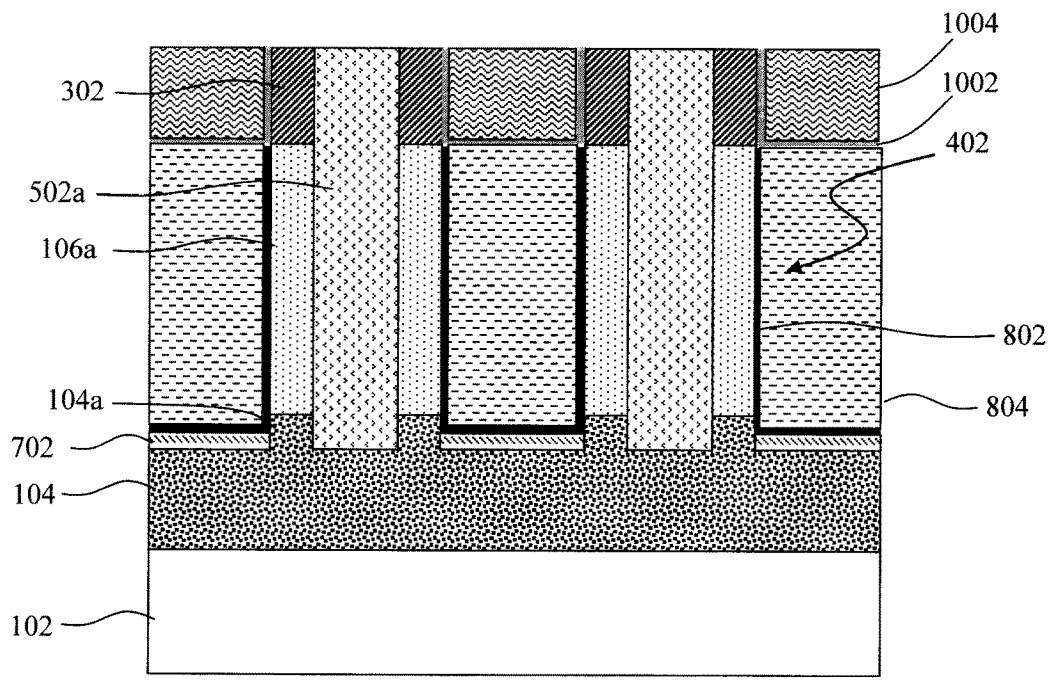
FIG. 10 is a cross-sectional diagram illustrating a thin, conformal nitride liner having been deposited onto and covering the tops of the gates, and an oxide fill having been deposited onto the conformal nitride liner according to an embodiment of the present invention.

As shown in FIG. 9, the gate dielectric 802 and the gate conductor 804 are recessed. According to an exemplary embodiment, the gate dielectric 802 and the gate conductor 804 are recessed using an anisotropic etching process such as RIE to be below the fin hardmasks 302. See FIG. 9.

In order to protect the gates during subsequent processing, a thin, conformal nitride liner 1002 is deposited onto and covering the tops of the gates. See FIG. 10. Suitable materials for the conformal nitride liner 1002 include, but are not limited to, SiN and/or SiON. According to an exemplary embodiment, the conformal nitride liner 1002 is formed having a thickness of from about 2 nanometers (nm) to about 5 nm, and ranges therebetween.

The next task will be to recess (via a recess etch) the portion 502a of the conformal dielectric 502 within the pairs of fins 402. However, the similarity in composition between the conformal dielectric 502 and the conformal nitride liner 1002 would compromise the conformal nitride liner 1002 during the recess etch. Thus, an oxide fill 1004 is first deposited onto the conformal nitride liner 1002. See FIG. 10. The oxide fill 1004 protects the conformal nitride liner 1002 during the recess etch of the conformal dielectric 502 in between the fins 402 in each pair. In turn, the conformal nitride liner 1002 protects the underlying gates from oxidation by the oxide fill 1004. Suitable materials for the oxide fill 1004 include, but are not limited to, $SiO_2$ and/or silicon carbon oxide (SiCO). As-deposited, any excess oxide fill 1004 can be removed using a process such as chemical-mechanical polishing (CMP).

Figure 11:
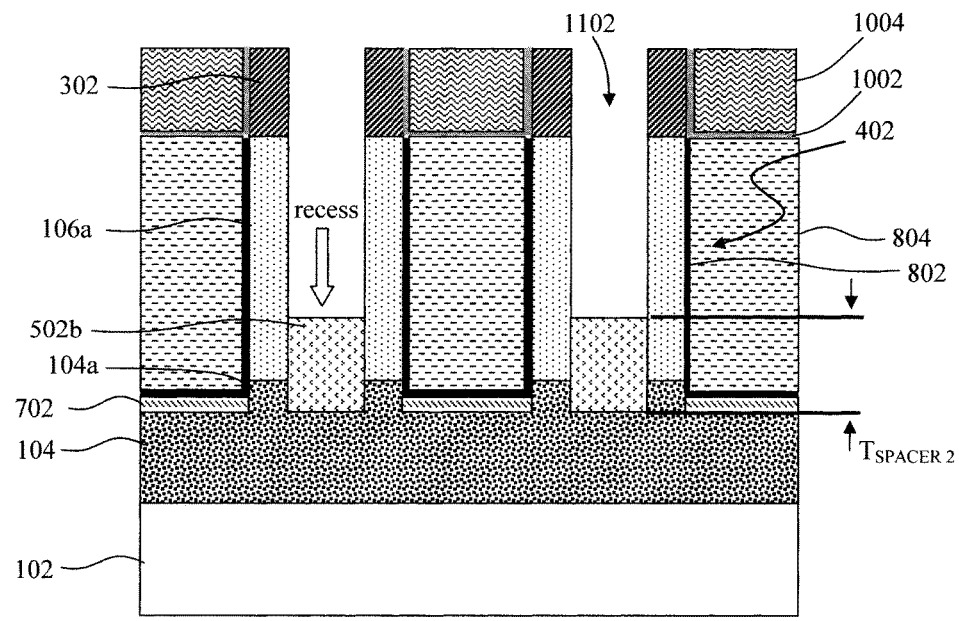
FIG. 11 is a cross-sectional diagram illustrating a recess etch having been performed to (partially) recess the portion of the conformal nitride film within the pairs of fins, forming trenches within the pairs of fins and (second) bottom spacers at the bottoms of the trenches according to an embodiment of the present invention.

With protection over the gates, an etch is then performed to recess the portion 502a of the conformal dielectric 502 within the pairs of fins 402. See FIG. 11. The recess etch forms trenches 1102 within the pairs of fins 402 and, as shown in FIG. 11, following the recess etch a portion of the conformal dielectric 502 remains in between the fins 402 in each pair (i.e., only a partial recess of the conformal dielectric 502 is performed). This portion of the conformal dielectric 502 forms (second) bottom spacers 502b at the bottoms of the trenches 1102. It is notable that the (first) bottom spacers 702 are present on the doped epitaxial drain layer 104 between the pairs of fins 402, while the (second) bottom spacers 502b are present on the doped epitaxial drain layer 104 between the fins 402 within each pair. Thus, the thickness of the spacer varies within the pair of fins 402 vis-à-vis the spacer thickness between the pairs of fins 402.

As shown in FIG. 11, the bottom spacers 502b have a thickness ($T_{SPACER2}$). According to an exemplary embodiment, $T_{SPACER2} > T_{SPACER1}$, wherein $T_{SPACER1}$ is the thickness of the bottom spacers 702 (see above). The reason for this thickness difference is that while the (first) bottom spacers 702 offset the gates from the drain, the (second) bottom spacers 502b are needed to offset the source from the drain.

Figure 12:
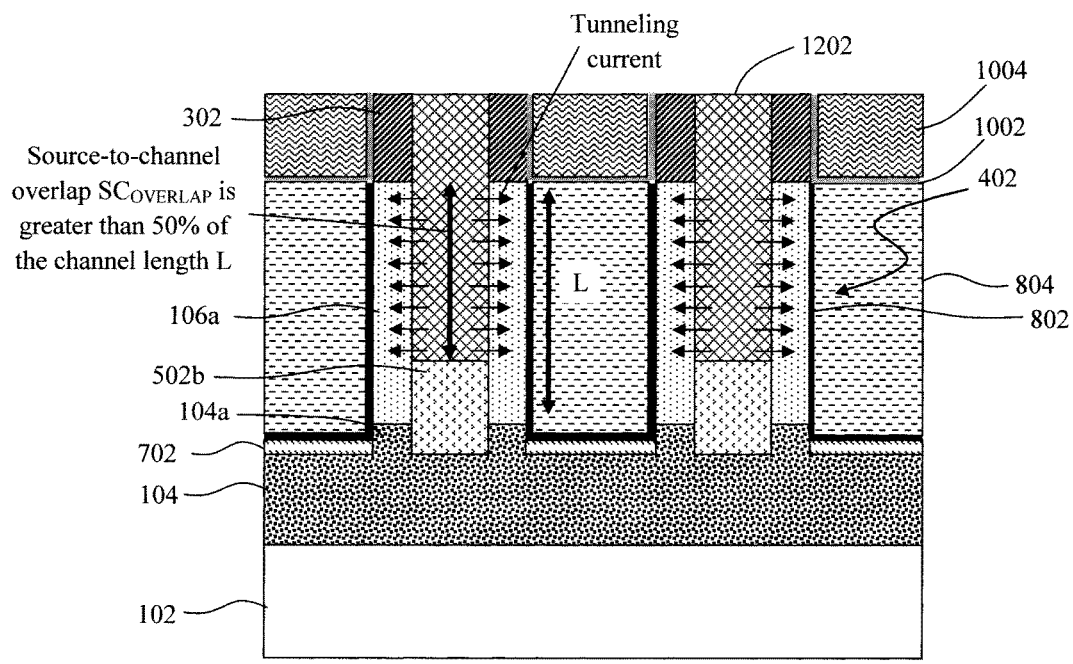
FIG. 12 is a cross-sectional diagram illustrating a doped epitaxial source layer having been grown in the trenches on top of the (second) bottom spacers according to an embodiment of the present invention.

Namely, as shown in FIG. 12 a doped source layer 1202 is formed in the trenches 1102 on top of the bottom spacers 502b. Doping can be performed using processes such as ion implantation, in situ, gas phase doping, plasma doping, plasma immersion ion implantation, cluster doping, infusion doping, liquid phase doping, solid phase doping, etc., and dopants may include, for example, an n-type dopant such as phosphorus (P), arsenic (As) and antimony (Sb), and a p-type dopant such as boron (B), boron fluoride ($BF_2$), gallium (Ga), indium (In), and thallium (Tl) at various concentrations. By way of example only, the dopant concentration can be from about $1 \times 10^{18}$ atoms/cm$^3$ to about $5 \times 10^{21}$ atoms/cm$^3$. However, lower and higher dopant concentrations can also be contemplated.

According to an exemplary embodiment, the doped source layer 1202 is an epitaxial material grown in the trenches 1102 on top of the bottom spacers 502b, whereby the epitaxial growth is templated from the sidewalls of the vertical fin channels exposed within the trenches 1102. Suitable epitaxial materials for the doped epitaxial source layer 1202 include, but are not limited to, epitaxial Si, epitaxial Ge and/or epitaxial SiGe that is in-situ doped (i.e., during growth) or ex-situ doped (e.g., via a process such ion implantation). Suitable n-type and p-type dopants were provided above.

As shown in FIG. 12, the present vertical TFET device has a large source-to-channel overlap, thus providing a large tunneling area for tunneling current. For instance, according to an exemplary embodiment, the vertical fin channels (i.e., portions 106a of the intrinsic epitaxial Si layer 106—see above) have a channel length L, and the source-to-channel overlap (i.e., the length of the overlap between the source and the vertical fin channels ($SC_{OVERLAP}$) is greater than 50% of the channel length L, i.e., $SC_{OVERLAP} > \frac{1}{2} L$.

As provided above, the positioning of the sources and the gates vis-à-vis the pairs of adjacent vertical fin channels can be switched such that the gates, rather than the sources, are present between the pairs of adjacent vertical fin channels. This alternative exemplary embodiment is now described by way of reference to FIGS. 13-19. The initial stages of this alternative embodiment follow the same process flow as described in conjunction with the description of FIGS. 1-6, above. Thus, what is shown in FIG. 13 follows from FIG. 6, and for consistency the same structures are numbered alike in the following description.

As provided above, at present the vertical TFET structure includes fins 402 patterned in the intrinsic epitaxial semiconductor layer 106 and the doped drain layer 104, wherein portions 106a of the fins patterned in the intrinsic semiconductor layer 106 form the vertical fin channels of the TFET. As above, the fins 402 are patterned in pairs, wherein the fins 402 within each pair are spaced apart from one another by a spacing S1, and the pairs are spaced apart from one another by a spacing S2, wherein S1<S2. That way, a portion 502a of the (recessed) conformal dielectric 502 remains fully filling the gap between the fins 402 in each pair.

Figure 13:
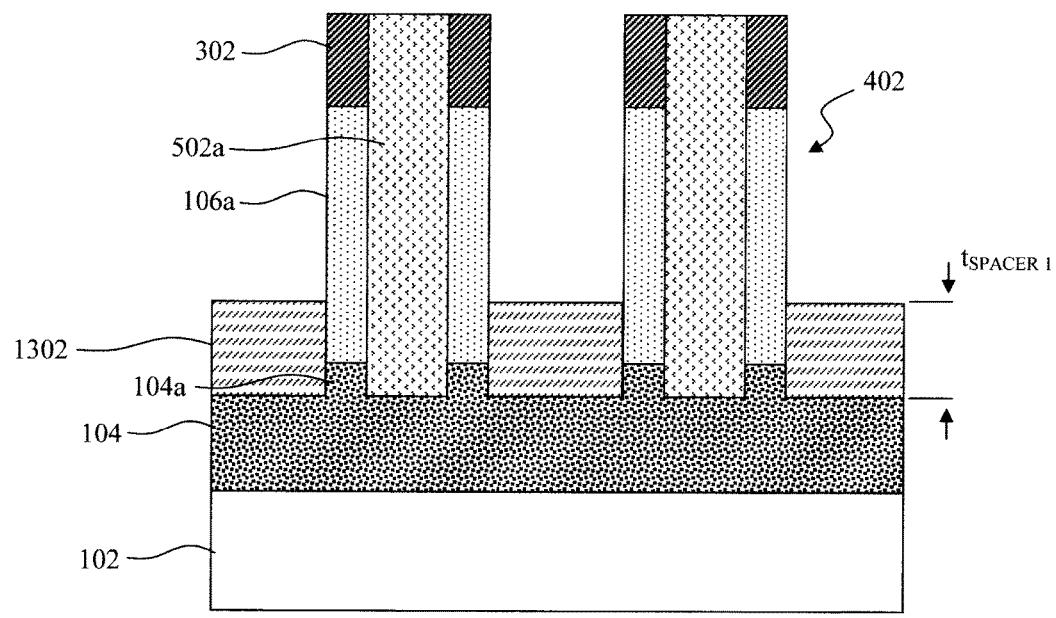
FIG. 13 is a cross-sectional diagram which follows from FIG. 6 illustrating, according to an alternative embodiment, (first) bottom spacers having been formed on the doped epitaxial drain layer in between the (pairs) of fins according to an embodiment of the present invention.

Next, as shown in FIG. 13, (first) bottom spacers 1302 are formed on the doped drain layer 104 (i.e., the drain) in between the fins 402. According to an exemplary embodiment, the bottom spacers 1302 are formed using a directional deposition process whereby a spacer material is deposited onto the doped epitaxial drain layer 104 and fins 402 with a greater amount of the material being deposited on the horizontal surfaces, as compared to the vertical surfaces. Thus, when an etch is used on the spacer material, the timing of the etch needed to remove the spacer material from the vertical surfaces will leave the bottom spacers 1302 shown in FIG. 13 on top of the doped drain layer 104 (i.e., the drain) since a greater amount of the spacer material was present on the doped drain layer 104 to begin with.

As shown in FIG. 13, the bottom spacers 1302 have a thickness ($t_{SPACER1}$). As will be described in detail below, second bottom spacers will be formed that are thinner than bottom spacers 1302. Namely, since the locations of the sources and gates are switched in this case (as compared to the example above) the function of the bottom spacers is switched as well. Thus, the (first) bottom spacers 1302 will serve to offset the source from the drain, while the second bottom spacers will serve to offset the gates from the drain. As such, the (first) bottom spacers 1302 in this example are the thicker spacer.

As above, a HDP CVD or PVD process can be used for directional film deposition, and an isotropic etch can be used to remove the (thinner) spacer material deposited onto the vertical surfaces. Suitable materials for the bottom spacers 1302 include, but are not limited to, oxide spacer materials such as $SiO_2$ and/or SiCO, and nitride spacer materials such as SiN, SiBCN, SiOCN, and/or SiCN or combinations thereof.

Figure 14:
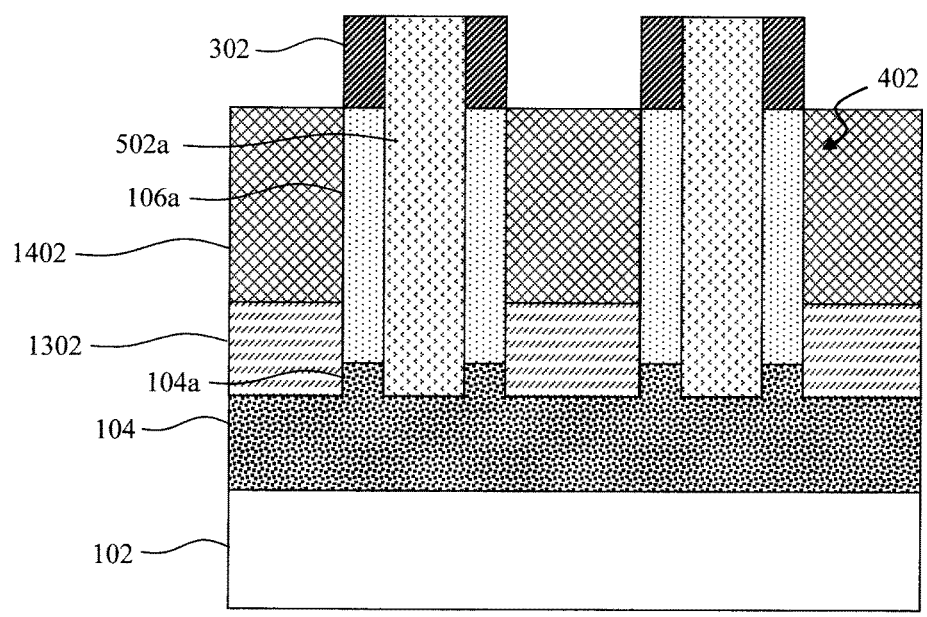
FIG. 14 is a cross-sectional diagram illustrating a doped epitaxial source layer having been grown along outer sides of each pair of fins on top of the (first) bottom spacers according to an embodiment of the present invention.
Figure 15:
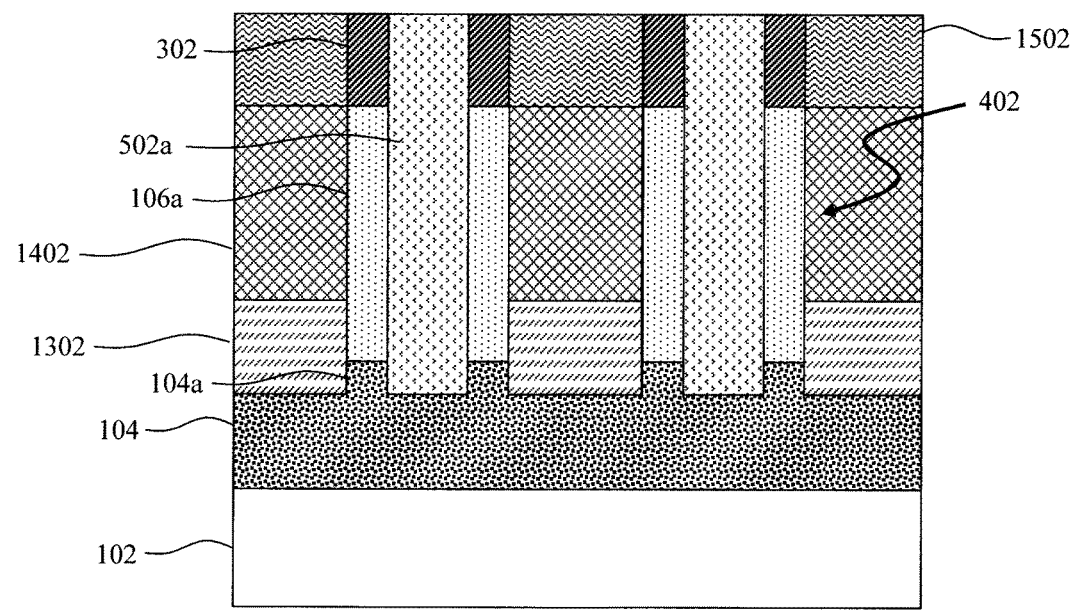
FIG. 15 is a cross-sectional diagram illustrating an oxide fill having been deposited onto the doped epitaxial source layer according to an embodiment of the present invention.

As shown in FIG. 14 a doped source layer 1402 is formed along outer sides of each pair of fins 402 on top of the bottom spacers 1302. According to an exemplary embodiment, the doped source layer 1402 is formed from an epitaxial material grown along the outer sides of each pair of fins 402 on top of the bottom spacers 1302, whereby epitaxial growth is templated from the sidewalls of the vertical fin channels (i.e., portions 106a of intrinsic semiconductor layer 106) exposed along the sidewalls of the fins 402. Suitable epitaxial materials for the doped source layer 1402 include, but are not limited to, epitaxial Si, epitaxial Ge and/or epitaxial SiGe that is in-situ doped (i.e., during growth) or ex-situ doped (e.g., via a process such ion implantation) with an n-type or a p-type dopant. Suitable n-type and p-type dopants were provided above.

The doped source layer 1402 will serve as the sources of the vertical TFET devices. Thus, as shown in FIG. 14 the bottom spacers 1302 offset the source (doped source layer 1402) from the drain (doped drain layer 104).

The next task will be to recess (via a recess etch) the portion 502a of the conformal dielectric 502 within the pairs of fins 402. However, in order to protect the sources during subsequent processing, an oxide fill 1502 is first deposited onto the doped source layer 1402. See FIG. 15. Suitable materials for the oxide fill 1502 include, but are not limited to, $SiO_2$ and/or SiCO. As deposited, any excess oxide fill 1502 can be removed using a process such as CMP.

In the example above, a thin, conformal nitride liner was placed prior to the oxide fill to prevent oxidation of the gate materials. In this case, however, the gates have not yet been formed. As such the nitride liner is not needed, thereby streamlining the fabrication process flow.

Figure 16:
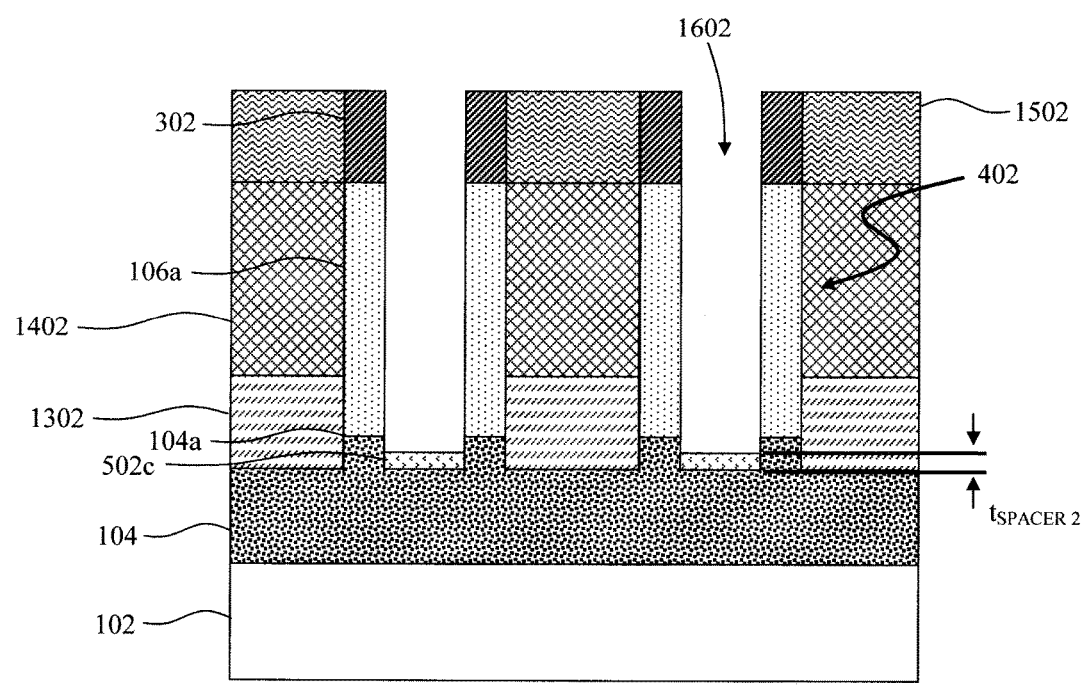
FIG. 16 is a cross-sectional diagram illustrating a recess etch having been performed to (partially) recess the portion of the conformal nitride film within the pairs of fins, forming trenches within the pairs of fins and (second) bottom spacers at the bottoms of the trenches according to an embodiment of the present invention.
Figure 17:
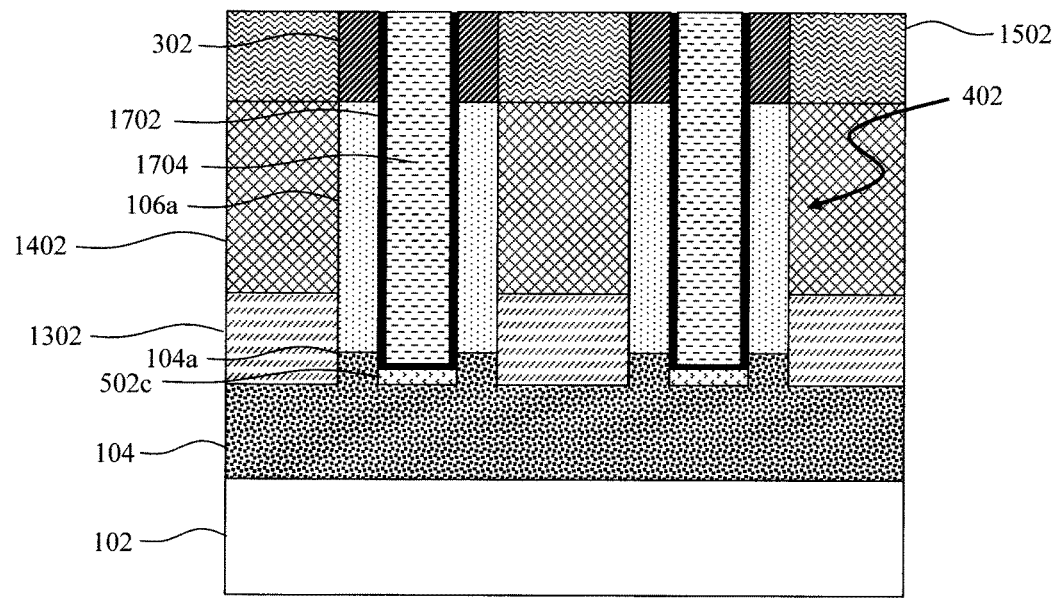
FIG. 17 is a cross-sectional diagram illustrating gates having been formed within the trenches by depositing a conformal gate dielectric and gate conductor into the trenches on top of the (second) bottom spacers according to an embodiment of the present invention.

An etch is then performed to recess the portion 502a of the conformal dielectric 502 within the pairs of fins 402. See FIG. 16. The recess etch forms trenches 1602 within the pairs of fins 402 and, as shown in FIG. 16, following the recess etch a portion of the conformal dielectric 502 remains in between the fins 402 in each pair (i.e., only a partial recess of the conformal dielectric 502 is performed). This portion of the conformal dielectric 502 forms (second) bottom spacers 502c at the bottoms of the trenches 1602. It is notable that the (first) bottom spacers 1302 are present on the doped drain layer 104 between the pairs of fins 402, while the (second) bottom spacers 502c are present on the doped drain layer 104 between the fins 402 within each pair. Thus, the thickness of the spacer varies within the pair of fins 402 vis-à-vis the spacer thickness between the pairs of fins 402.

As shown in FIG. 16, the bottom spacers 502c have a thickness ($t_{SPACER2}$). According to an exemplary embodiment, $t_{SPACER2} < t_{SPACER1}$, wherein $t_{SPACER1}$ is the thickness of the bottom spacers 1302 (see above). The reason for this thickness difference is that while the (first) bottom spacers 1302 offset the source from the drain, the (second) bottom spacers 502c are needed to offset the gates from the drain.

Gates (i.e., a gate dielectric and a gate conductor) are now formed within the trenches 1602 on top of the bottom spacers 502c. According to an exemplary embodiment, the gates include a conformal gate dielectric 1702 that is deposited into the trenches 1602 (lining the trenches 1602 and covering the bottom spacers 502c), and a gate conductor 1704 that is deposited onto the gate dielectric 1702. See FIG. 17. In one exemplary embodiment, the conformal gate conductor 1704 is a workfunction-setting metal, and the conformal gate dielectric 1702 is a high-κ gate dielectric.

The gate dielectric 1702 can be formed by a conformal deposition (e.g., ALD or PEALD), where the deposition forms a gate dielectric 1702 of a predetermined thickness. According to an exemplary embodiment, the gate dielectric 1702 has a thickness of from about 2 Å to about 10 nm and ranges therebetween, for example, from about 4 Å to about 5 nm and ranges therebetween, e.g., from about 1 nm to about 3 nm and ranges therebetween. In one exemplary embodiment, the gate dielectric 1702 is an insulating dielectric, for example, SiO, SiN, SiON, a high-κ dielectric, or combinations thereof. In another exemplary embodiment, the gate dielectric 1702 is a high-κ dielectric material including, but not limited to, transition metal oxides such as $HfO_2$, $HfSiO_4$, $Hf_wSi_xO_yN_z$, $La_2O_3$, $LaAlO_3$, $ZrO_2$, $ZrSiO_4$, $Zr_wSi_xO_yN_z$, $TaO_2$, $Ta_2O_5$, $TiO_2$, $BaTiO_3$—$SrTiO_3$, $BaTiO_3$, $SrTiO_3$, $Y_2O_3$, $Al_2O_3$, $Pb(Sc_xTa_{1-x})O_3$, and $PbZn_{1/3}Nb_{2/3}O_3$. The high-κ material can further include dopants such as lanthanum and/or aluminum. The stoichiometry of the high-κ compounds can vary.

In one exemplary embodiment, the conformal gate conductor 1704 is a workfunction-setting metal. The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

In one exemplary embodiment, the conformal gate conductor 1704 is a workfunction-setting metal. The particular workfunction-setting metal employed can vary depending on whether an n-type or p-type transistor is desired. As provided above, suitable n-type workfunction-setting metals include, but are not limited to, TiN, TaN and/or Al-containing alloys such as TiAl, TiAlN, TiAlC, TaAl, TaAlN, and/or TaAlC. Suitable p-type workfunction-setting metals include, but are not limited to, TiN, TaN, and/or W. TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Suitable high-κ gate dielectrics include, but are not limited to, $HfO_2$ and/or $La_2O_3$. According to an exemplary embodiment, the work function layer has a thickness of from about 3 nm to about 11 nm and ranges therebetween, for example, from about 5 nm to about 8 nm and ranges therebetween. The gate structure may further include appropriate conductive material including, e.g., metals such as tungsten, nickel, titanium, molybdenum, tantalum, copper, platinum, silver, gold, ruthenium, iridium, rhenium, rhodium, and alloys thereof, polysilicon, or a conducting metallic compound material such as tantalum nitride, titanium nitride, tungsten silicide, tungsten nitride, ruthenium oxide, cobalt silicide, or nickel silicide. The conductive material may further include dopants that are incorporated during or after deposition.

Figure 18:
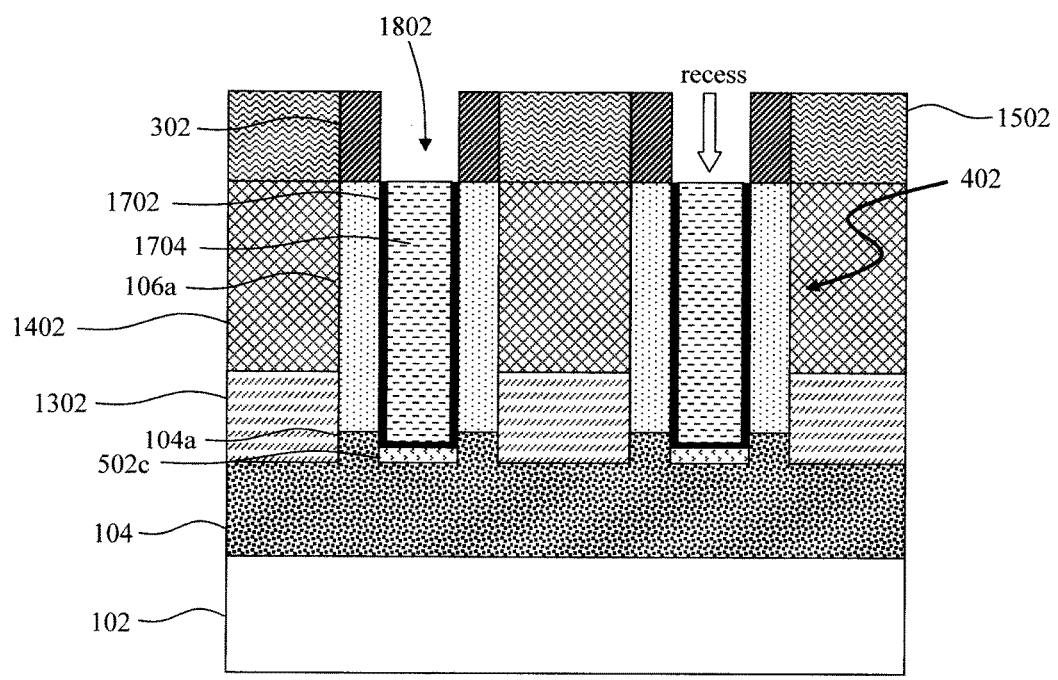
FIG. 18 is a cross-sectional diagram illustrating the gate dielectric and the gate conductor having been recessed according to an embodiment of the present invention.

As shown in FIG. 18, the gate dielectric 1702 and the gate conductor 1704 are recessed. According to an exemplary embodiment, the gate dielectric 1702 and the gate conductor 1704 are recessed using an anisotropic etching process such as RIE to be below the fin hardmasks 302. As shown in FIG. 18 this recess etch of the gate dielectric 1702 and the gate conductor 1704 creates recesses 1802 in between the fin hardmasks 302 above the gates.

Gate caps 1902 are then formed in the recesses 1802 on top of the gates. See FIG. 19. According to an exemplary embodiment, the gate caps 1902 are formed from a nitride material such as SiN and/or SiON. As deposited, any excess nitride material can be removed using a process such as CMP.

Figure 19:
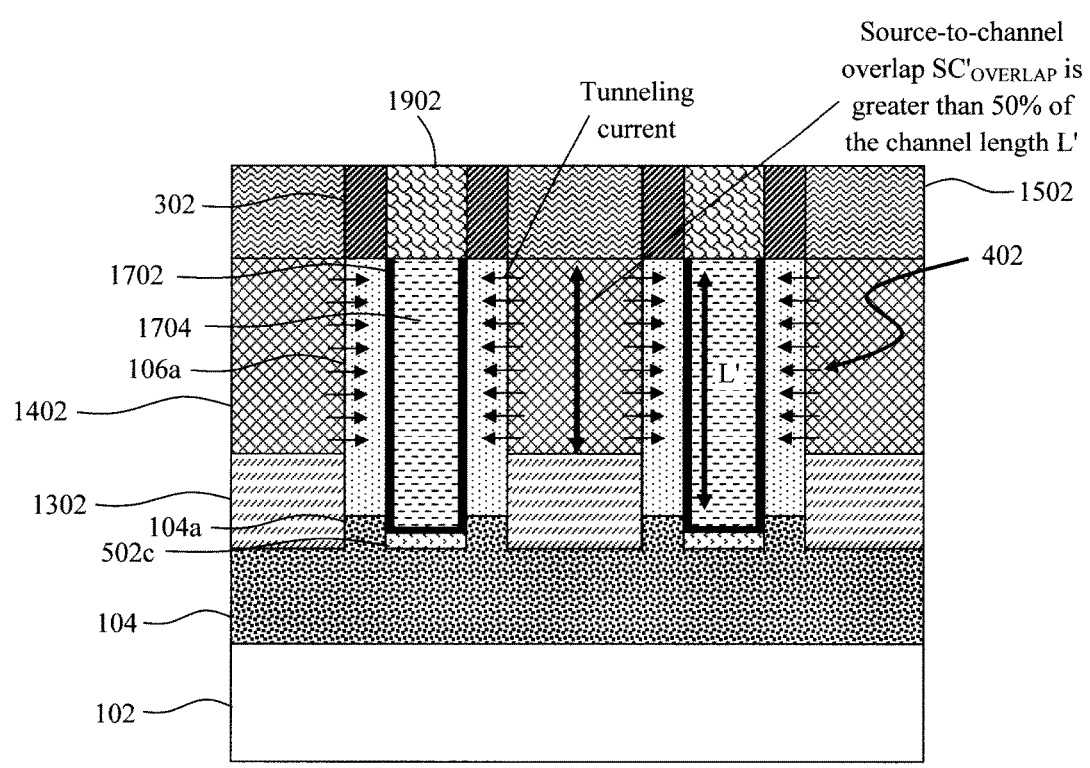
FIG. 19 is a cross-sectional diagram illustrating gate caps having been formed on top of the gates according to an embodiment of the present invention.

As shown in FIG. 19, the present vertical TFET device has a large source-to-channel overlap, thus providing a large tunneling area for tunneling current. For instance, according to an exemplary embodiment, the vertical fin channels (i.e., portions 106a of the intrinsic semiconductor layer 106—see above) have a channel length L, and the source-to-channel overlap (i.e., the length of the overlap between the source and the vertical fin channels ($SC'_{OVERLAP}$) is greater than 50% of the channel length L', i.e., $SC'_{OVERLAP} > \frac{1}{2} L'$.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical tunnel field effect transistor (TFET), the method comprising the steps of:
   forming a doped drain layer on a substrate;
   forming an undoped semiconductor layer on the doped drain layer;
   patterning at least one pair of fins in the undoped semiconductor layer and the doped drain layer, wherein portions of the at least one pair of fins patterned in the undoped semiconductor layer comprise vertical fin channels;
   filling a gap between the at least one pair of fins with a dielectric;
   forming first bottom spacers on the doped drain layer outside of the at least one pair of fins;
   forming gates along outer sides of the at least one pair of fins;
   partially recessing the dielectric to form a trench in between the at least one pair of fins with a portion of the dielectric film remaining as second bottom spacers in the trench; and
   forming a doped source layer in the trench on top of the second bottom spacers and overlapping the vertical fin channels,
   wherein an overlap of the doped source layer and the vertical fin channels is greater than 50% of a length of the vertical fin channels.

2. The method of claim 1, wherein the first bottom spacers have a thickness $T_{SPACER1}$, wherein the second bottom spacers have a thickness $T_{SPACER2}$, and wherein $T_{SPACER2} > T_{SPACER1}$.

3. The method of claim 1, further comprising the steps of:
   depositing a conformal nitride liner onto tops of the gates; and
   depositing an oxide fill onto the nitride liner.

4. The method of claim 1, wherein the step of filling the gap between the at least one pair of fins comprises the steps of:
   depositing a conformal dielectric film that pinches off the gaps between the at least one pair of fins; and
   recessing the conformal dielectric film such that the dielectric film remains in the gaps between the at least one pair of fins.

5. The method of claim 1, wherein the step of forming the gate comprises the steps of:
   depositing a conformal gate dielectric along the outer sides of the at least one pair of fins; and
   depositing a gate conductor onto the conformal gate dielectric.

6. The method of claim 5, wherein the conformal gate dielectric is selected from the group consisting of: silicon oxide (SiO), silicon nitride (SiN), silicon oxynitride (SiON), a high-K dielectric, and combinations thereof.

7. The method of claim 5, wherein the gate conductor comprises a workfunction-setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

8. The method of claim 1, further comprising the step of:
   patterning at least one first pair of fins and at least one second pair of fins in the undoped semiconductor layer and the doped drain layer.

9. The method of claim 8, wherein a spacing S1 is present between fins in the at least one first pair of fins and between fins in the at least one second pair of fins, wherein a spacing S2 is present between the at least one first set of fins and the at least one second set of fins, and wherein S1<S2.

* * * * *